United States Patent [19]
Roth et al.

[11] Patent Number: 5,739,689
[45] Date of Patent: Apr. 14, 1998

[54] SUPERCONDUCTING NMR MAGNET CONFIGURATION

[75] Inventors: Gerhard Roth, Rheinstetten; Arne Kasten, Karlsruhe, both of Germany

[73] Assignee: Bruker Analytik GmbH, Rheinstetten, Germany

[21] Appl. No.: 757,702

[22] Filed: Dec. 3, 1996

[30] Foreign Application Priority Data

Dec. 22, 1995 [DE] Germany ............... 195 48 272.7

[51] Int. Cl.⁶ ............................................. G01V 3/00
[52] U.S. Cl. .................................. 324/320; 324/319
[58] Field of Search ................................ 324/319, 320, 324/321, 318, 300; 62/51.1; 335/296

[56] References Cited

U.S. PATENT DOCUMENTS

| | | | |
|---|---|---|---|
| 5,168,211 | 12/1992 | Laukien et al. | 324/319 |
| 5,220,800 | 6/1993 | Müller et al. | 62/51.3 |
| 5,412,363 | 5/1995 | Breneman et al. | 324/319 |
| 5,448,214 | 9/1995 | Laskaris | 324/319 |
| 5,545,997 | 8/1996 | Westphal et al. | 324/319 |

FOREIGN PATENT DOCUMENTS 2243218  10/1991  United Kingdom.

OTHER PUBLICATIONS

"A superconducting magnet system of a polarized proton target" by A.Ya.Derkach et al. in Cryogenics, Sep. 1978, pp. 539–541.

*Primary Examiner*—Louis M. Arana
*Attorney, Agent, or Firm*—Paul Vincent

[57] ABSTRACT

The invention concerns a superconducting magnet configuration for a high resolution NMR spectrometer which is highly stable over time and having a cryostat (21) with a vertical room temperature bore (23). A transverse access (32) through the cryostat (21) to the room temperature bore (23) is provided for at an easily accessible height directly above the upper end of the superconducting magnet coil (25) to substantially simplify the introduction of a sample. In a system having two helium tanks (26, 27), it is advantageous to have the access (32) arranged between these helium tanks.

13 Claims, 2 Drawing Sheets

SUPERCONDUCTING NMR MAGNET CONFIGURATION

BACKGROUND OF THE INVENTION

The invention concerns a superconducting magnet configuration, in particular for an analytic NMR spectrometer, with a substantially cylindrical cryostat having a vertical cylinder axis and a vertical room temperature bore and with at least one tank for the acceptance of a cryogenic liquid in thermal contact with a superconducting magnet coil and producing an extremely homogeneous and stable magnetic field in a measuring region of the room temperature bore.

A superconducting magnet configuration of this type is, for example, known in the art from U.S. Pat. No. 5,220,800.

Stringent requirements with respect to the homogeneity and the stability of the magnetic field in the measuring volume are demanded of magnet coils in high resolution NMR spectrometers as described in detail in the above mentioned laid open publication. In order to increase the signal strength and spectrometer resolution, it is most importantly desirable to further increase the magnetic field strength without thereby endangering the homogeneity and stability. The current highest magnetic field strengths suitable for NMR lie in the range of 18,8 Tesla (800 MHz proton frequency). The first measurements at this field strength were carried out with a magnet system having a series of features corresponding to those described in the above mentioned laid open publication. In addition to excellent homogeneity and stability, extremely low coolant losses are also very important. As described in the above mentioned laid open publication these properties are often contingent upon one another.

High field strengths using conventional technology will of course require larger magnetic coils and therefore larger cryostats.

In the above cited magnet coil configuration, the coil is additionally located in a tank having supercooled helium which is beneath a storage tank having helium at 4.2 K. Both are surrounded by radiation shields and a nitrogen tank. This causes the cylindrically shaped cryostat to have a relatively large diameter and also be very tall. The so-called probe head, with the measuring electronics, is inserted into the room temperature bore of the cryostat from below. Towards this end it is necessary that a sufficient amount of room be available in the floor region. The sample is generally supported on a stream of gas and lowered from above into the center of the magnetic field. In the event that the sample is to be changed by hand it is thereby necessary to climb onto a platform. The radial separation between the outer jacket of the cryostat and the room temperature bore is comparable to the length of an arm which thereby complicates exchange of the probe head or alignment work at the lower region as well as the sample change at the upper region.

There is therefore a need to improve the superconducting magnet configuration of the above mentioned kind in such a fashion that access to the room temperature bore is improved without negatively influencing the properties necessary for spectrometer operation.

SUMMARY OF THE INVENTION

This purpose is achieved in that a transverse room temperature access to the vertical room temperature bore of the cryostat is provided for in the region directly above the superconducting magnet coil, wherein an inner tank for the acceptance of a cryogenic liquid, preferentially liquid helium at 4.2 K, is located in the cryostat directly above the transverse room temperature access.

This transverse access facilitates the introduction of an NMR sample which is to be measured onto the axis of the vertical room temperature bore at a comfortable height which can be reached by a user of a spectrometer either directly or with the assistance of a small platform and to be lowered therefrom into the center of the magnet using conventional pneumatic means.

A superconducting magnet system for a polarized proton target is known in the art through the British journal "CRYOGENICS"; September 1978, pages 539–541 with which a horizontal access is provided to the target in the measuring center of the apparatus for electrons and gamma rays, the proton target being accommodated in an individual cryostat.

Cylindrical cryostats for superconducting magnet coils having axial room temperature bores and an additional transverse access are, in and of themselves, known in the art, but not for high resolution NMR spectroscopy. For example such a magnet system has become known in the art of NMR tomography through U.S. Pat. No. 5,168,211. The conventional system has a horizontal magnetic axis. The magnet coil is divided and the transverse access is located between the two coil halves and leads to a measuring region about the magnetic center. The transverse access hereby creates an alternate observation and access possibility during the investigational process. It is absolutely necessary for the magnetic coil to be divided in an appropriate fashion and have the appropriate separation between the coil halves. In contrast thereto, the magnet coil of the magnet configuration in accordance with the invention remains a continuous solenoid and although the transverse access extends up to the axis of the magnet coil, it does not go into the center and therefore into the measurement region, rather to an axial position outside of the magnet coil.

This axial position should lie as closely adjacent to and above the upper edge of the magnet coil as possible, whereby the required thermal insulation means constitute restraints requiring vertical space. In addition, electrical terminals and connecting elements are generally located directly above the superconducting magnet which can require the transverse room temperature bore to be axially displaced somewhat further in the upper direction.

The transverse access can, in the simplest case, be a cylindrical bore having a horizontal cylinder axis either on one side up to the vertical room temperature bore or going entirely through. A plurality of star-shaped bores are also possible. This has the advantage of a relatively simple cryostat construction following conventional principles.

The transverse access can also however be a "pie-slice" cut out of the cryostat. This has the advantage of improved accessibility over an enlarged angular region.

Alternatively, the cryostat can comprise two largely cylindrical vessel portions disposed vertically above and below each other which are cryotechnically connected to each other by a plurality, preferentially three or four, of cylindrically shaped connecting components disposed symmetrically about the vertical cylinder axis and having a diameter which is small compared to the diameters of the vessel portions. In this fashion, the accessibility is improved to a further extent and the symmetry is largely maintained.

It is preferred but not necessary when the upper and the lower vessel portions have the same diameter. In particular, the upper portion could also have a larger diameter to facilitate sufficient storage volume for the cryogenic liquids (in general liquid helium and liquid nitrogen) while maintaining a somewhat reduced overall structural height. The diameter of the lower vessel portion is advantageously minimized, i.e. it is largely determined by the coil diameter and by the cryotechnically required shielding elements, such as vacuum components with radiation shields at a plurality of temperatures. It is, for example, possible for the nitrogen tank in the lower vessel portion to be done away with and replaced by a radiation shield coupled to a nitrogen tank in the upper vessel portion. A helium tank containing the magnet coil can directly surround same in the lower vessel portion while having a larger diameter in the upper vessel portion.

In an advantageous improvement only the lower vessel portion containing the magnet coil has a vertical room temperature bore. In this fashion the full volume of the upper vessel portion can be utilized for storage of the cryogenic liquid without encroaching upon the usability of the apparatus, since only the lower portion of the cryostat having the superconducting magnet coil is actually used for NMR measurements.

An embodiment is also advantageous with which the vertical extent of the cylindrical connecting components corresponds approximately to the axial length of a sample tube for liquid or solid NMR samples. A standard sample tube having the NMR measuring sample can thereby easily be introduced into the apparatus from the side without wasting room in the vertical direction which is normally limited by the height of the ceiling.

In a particularly preferred embodiment of the invention and analogous to the above mentioned U.S. Pat. No. 5,220,800, the cryostat comprises a first helium tank in a lower vessel portion in which the magnet coil is surrounded by supercooled liquid helium having a temperature below 4.2 K and the cryostat comprises an additional helium tank in the upper vessel portion having helium essentially at atmospheric pressure and 4.2 K and the two helium tanks are connected to each other in such a fashion that the helium located in the first tank is likewise largely at atmospheric pressure. The advantages of a two tank configuration of this kind for a high resolution NMR spectroscopy magnet system are thoroughly described in the above cited laid open publication. Although, the transverse access somewhat increases heat input due to additional radiation losses, the larger separation compared to the vacuum wall of U.S. Pat. No. 5,220,800 between the two helium tanks leads to a marked reduction in critical heat input into the lower tank via unavoidable suspension means so that, in total, the losses are actually reduced, however, at the expense of overall structural height. In embodiments having cylindrical connecting components between the two vessel portions, an excess pressure valve having a large cross section is provided for in one of these portions. Additional measures for minimizing coolant losses and for increasing the stability as described in U.S. Pat. No. 5,220,800, the complete contents of which is hereby incorporated by reference, can be likewise utilized in an advantageous manner in the present invention.

An eccentric configuration of the room temperature bore and thereby necessarily of the surrounding magnet coil can lead to a reduction in the separation between the bore and the still largely cylindrical outer jacket of the cryostat at one side to thereby increase accessibility to both ends of the bore. Although the separation is increased in other angular regions around the girth, accessibility is not required there. A magnet system having an eccentric room temperature bore is described in the German Patent Application having the Ser. No. 195 09 314.3-33, which was published after the priority date of the current invention, the complete contents of which is hereby incorporated by reference.

In a preferred embodiment of the invention the cryostat has at least two cryostat towers. This has the conventional advantage that the coolant losses can be further reduced, while maintaining an acceptable overall structural height for the cylindrical main body of the cryostat, due to the lengthened path through the towers between cryogenic and room temperature.

In embodiments in which the connecting components between the two vessel portions are cylindrical, the towers are preferentially disposed vertically above the connecting components. This simplifies suspension of the magnet coil in the towers.

Embodiments are particularly preferred having two towers whose line of connection passes through the axis of the room temperature bore and which are equally separated from same or having three towers disposed around this axis to define at least an isosceles and preferentially an equilateral triangle. These symmetric configurations also largely avoid rotational moments when suspending the coils and are known in the art in conventional cryostats. However, in these cases, the axis of the room temperature bore is coincident with the cylinder axis of the cryostat. In embodiments of the cryostat in accordance with the invention these configurations assure that the coil is suspended in a largely symmetric fashion despite an eccentric arrangement thereof and the cooling means can evaporate symmetrically through the towers.

Additional advantages of the invention can be derived from the description and the accompanying drawing. The above mentioned features and those to be described further below can be utilized in accordance with the invention individually or collectively in arbitrary combination. The embodiments mentioned are not to be considered as exhaustive enumeration rather have exemplary character only.

The invention is represented in the drawing and will be more closely described and explained with regard to concrete embodiments.

DESCRIPTION OF THE PREFERRED EMBODIMENT

Figure 1:
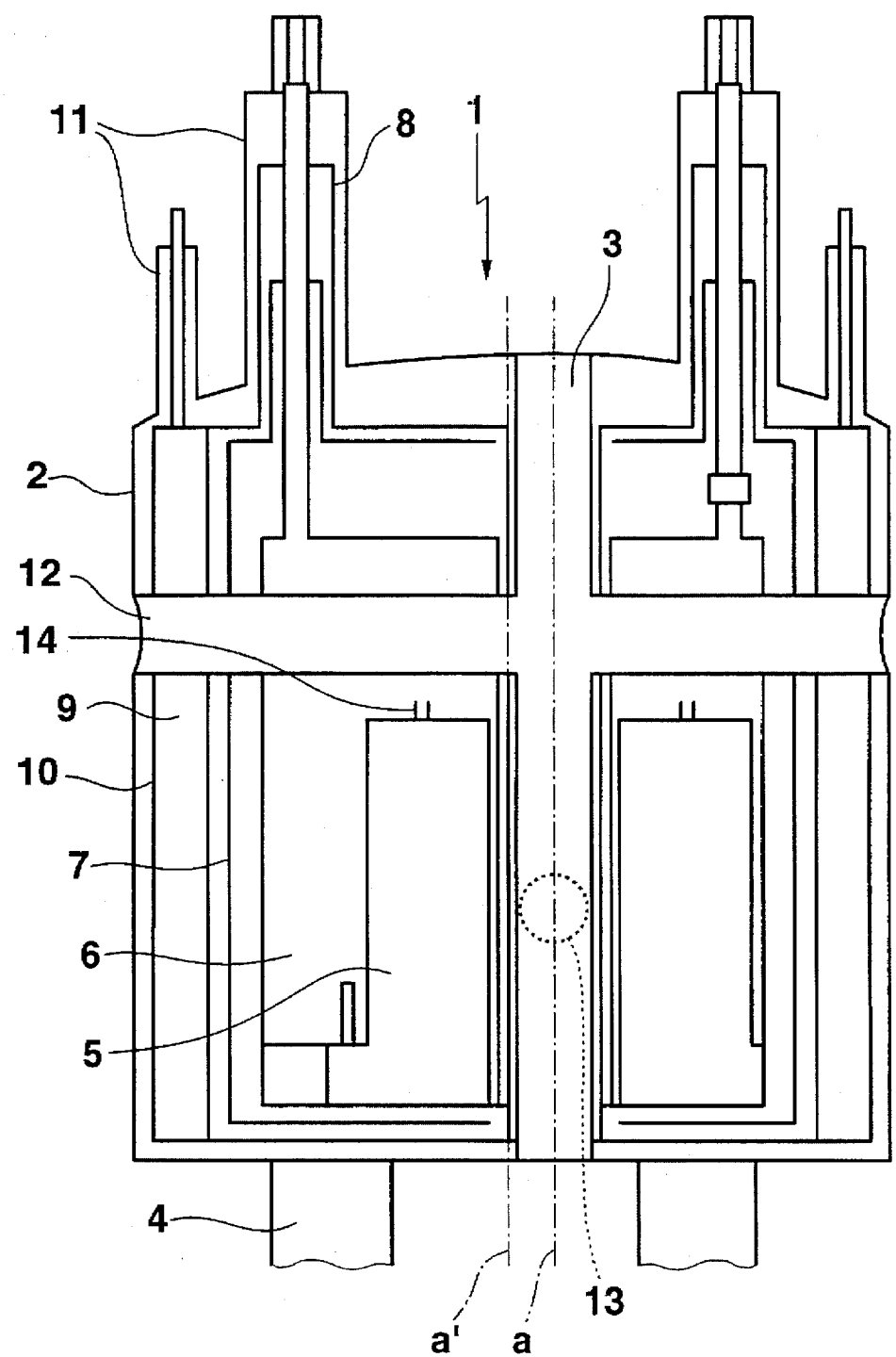
FIG. 1 shows the schematic construction of a first embodiment of an apparatus in accordance with the invention having a transverse access, in the form of a horizontal through hole, to an eccentric vertical room temperature bore of the cryostat.

In detail, FIG. 1 shows a cryostat 1, having a largely cylindrical housing 2, of an NMR magnet system for the production of a highly homogeneous, high strength magnetic field which is highly stable over time. The housing 2 has a cylindrical vertical room temperature bore 3 whose axis a is parallel to axis a' of the housing 2 but, in the embodiment, does not coincide with same. In this fashion the separation between the outer wall of the housing 2 and the room temperature bore 3 is reduced on one side.

The cryostat housing 2 stands on a so-called cryostat base 4 which provides space in the direction towards the floor so that a NMR probe head can be introduced from below into the room temperature bore 3 and electrical connections thereto can be established or changed. The probe head, with the NMR transmitter and receiver coil (not shown), must gain access to measuring region 13 within the room temperature bore 3 which coincides with the center of a superconducting magnet coil 5.

This superconducting magnet coil 5 is disposed in the lower region of the cryostat housing 2 within a helium tank 6 about the room temperature bore 3. The helium tank 6 is surrounded by a radiation shield 7 and by a nitrogen tank 9. A layer of so-called superinsultation 10 is located in vacuum between the nitrogen tank 9 and the outer wall of the housing 2. This sequence of cryotechnical shielding elements is in principle maintained for the transition from helium temperature in the helium tank 6 to room temperature outside the cryostat 1, wherein the inner volume between the tanks for the cryogenic liquids is evacuated.

The nitrogen tank 9 between helium tank 6 and room temperature bore 3 is replaced by an additional radiation shield 8 which is thermally coupled to the tank 9. A gas region above the cryogenic liquids extends only in the upward direction, in each case, via towers 11 of the cryostat 1 up to external atmosphere at room temperature, wherein conventional cryotechnical measures such as heat shields and barriers in the exhaust gas stream assure that the enthalpy of the evaporated cryogenic liquids is optimally utilized for cooling of the radiation and heat shields.

Transverse access 12 to the room temperature bore is provided for in accordance with the invention. In the embodiment, same is a cylindrically shaped transverse through-hole through the cryostat 1 above the magnet coil 5. The sequence of cryotechnical shielding elements between the helium tank 6 and the room temperature transverse bore 12 is the same as between helium tank 6 and the vertical room temperature bore 3, although this is not shown in FIG. 1 for reasons of clarity. In order to keep the transverse access 12 to the vertical room temperature bore 3 as short as possible on one side, the bore is located around the girth of the housing 2 at the position having the least separation from the vertical room temperature bore 3.

The transverse access 12 penetrates through the tanks 6, 9 which however both extend above and below the transverse access. In particular the maximum filling level of the helium tank 6 is significantly above the transverse access 12. In embodiments not shown it is possible for the nitrogen tank 9 to be replaced in sections by coupled radiation shields or in fact to be completely done away with in the event that, alternatively, a refrigerator with coupled radiation shields or sole cooling through evaporating helium gas is provided for. Electrical connections and connecting elements 14 are indicated above the magnet coil 5 which, if necessary, require that the transverse access, shielding not withstanding, not be located directly above the upper edge of the coil. The horizontal access 12 is normally also rotated relative to the towers 11 by (180/n)° for reasons of simplicity, where n is the number of towers.

In other embodiments not shown it is not necessary for the transverse access 12 to be a through hole, rather it is sufficient when it fashions a connection between the outer wall of the housing 2 and the vertical room temperature bore 3 on one side. The axis a of the vertical room temperature bore 3 can also coincide with the cryostat axis a' in symmetric embodiments. The transverse access 12 must not exhibit a circular cross section rather the cross section can widen from the inside towards the outside conically or in a "pie piece" fashion. Instead of one transverse bore 12 a plurality of transverse bores can be provided for extending in a star-shaped fashion towards the vertical room temperature bore Instead of the vertically continuous helium tank 6 which is however penetrated by the transverse access 12, two helium tanks at differing temperatures can also be provided for in connection with the embodiments shown in FIG. 1 as more closely described in the embodiment of FIG. 2.

Figure 2:
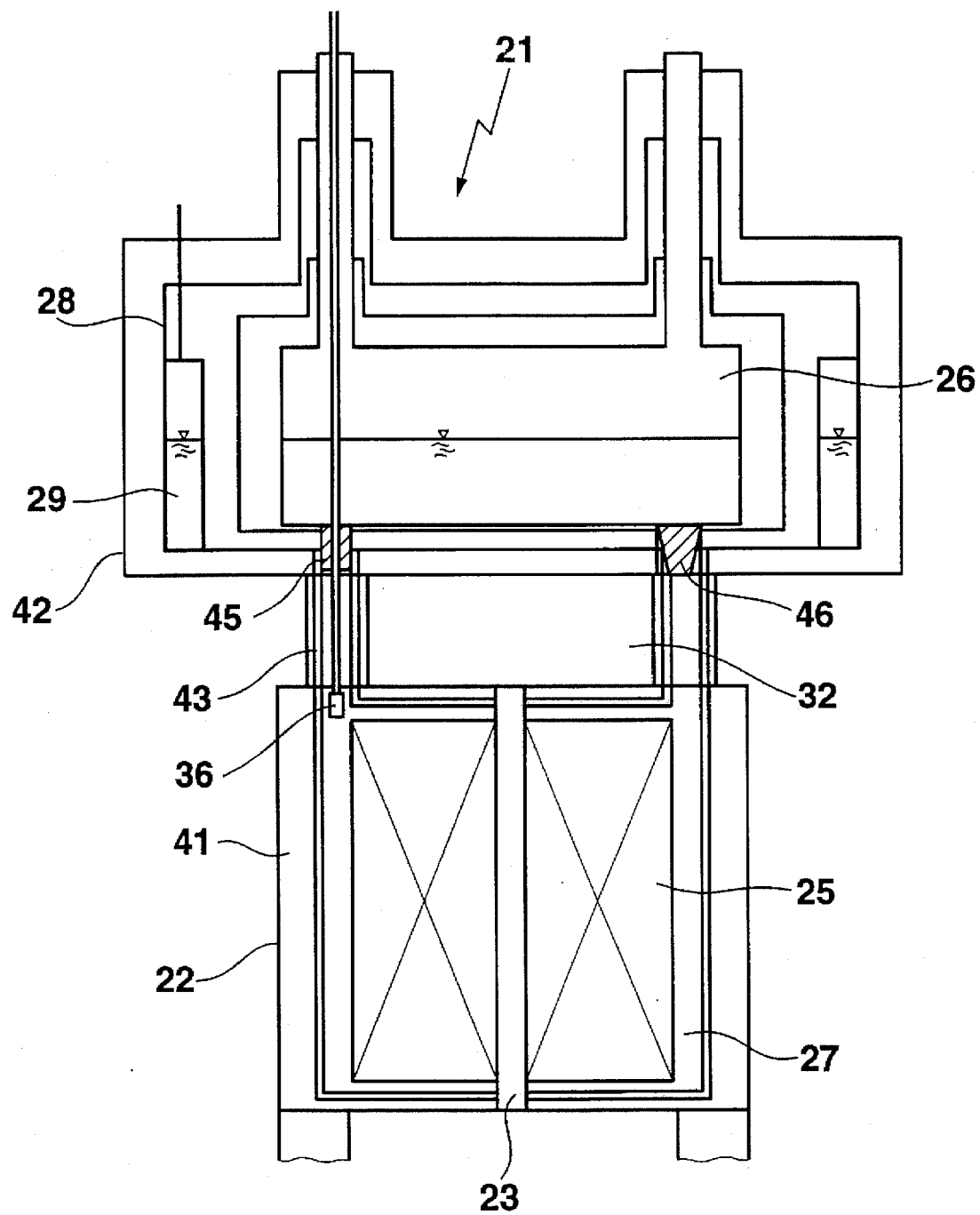
FIG. 2 shows the schematic construction of a second embodiment of an apparatus in accordance with the invention having a transverse access to the vertical room temperature bore of a cryostat by division of the cryostat into two vessel portions arranged above and below each other, wherein the upper one has a larger diameter than the lower one and with at least two symmetrically disposed cylindrical connecting components connecting these vessel portions.

FIG. 2 schematically shows a cryostat 21 of a NMR magnet system for the production of a highly homogeneous high strength magnetic field which is highly stable over time and having properties similar to those in the system according to U.S. Pat. No. 5,220,800, with the exception of transverse access to the room temperature bore 23. In the embodiment of FIG. 2, the transverse access 32 to the room temperature bore 23 is not realized in the form of bores, rather in that the cryostat housing 22 is divided into two vessel portions 41, 42 which are cryotechnically connected to each other by means of cylindrical vertical connecting elements 43. These, in the embodiment, four connecting elements 43 are disposed symmetrically around the room temperature bore 23.

The vessel portions 41, 42 and the connecting elements 43 form, as previously, a common cryostat housing 32 having a common vacuum portion. Since the transverse access 32 is encroached upon within a certain vertical region only by the presence of the connecting elements 43, the transverse access 32 is improved to an even greater extent compared to the embodiment of FIG. 1. The separation between the two vessel portions 41, 42 permits their diameters to no longer necessarily be equal. In the embodiment, the diameter of the upper vessel portion 42 is larger than that of the lower vessel portion 41. In this fashion the lower vessel portion 41 can be reduced to a minimal diameter precisely sufficient for acceptance of a sufficiently thermally shielded magnet coil 25, whereas the upper vessel portion 42 can have a larger diameter, as a result of which the overall structural height of the cryostat 21 can be reduced at constant volume of the tanks 26, 29 for the cryogenic liquids.

In the embodiments shown, a nitrogen tank 29 is disposed in the upper vessel portion 42 to which a radiation shield 28 is coupled which penetrates through the connecting elements 43 and also surrounds the helium tank 27 of the magnet coil 25 in the lower vessel portion 21. The magnet coil 25 is surrounded by supercooled helium in this tank 27, the temperature of which can be kept, via a refrigerator 36, at a desired temperature between 1.8 K and 2.3 K. The cryostat 21 then includes two helium tanks 26, 27, a storage tank 26 at atmosphere pressure for liquid helium at approximately 4.2 K as well as the tank 27 for supercooled helium at lower temperature in the lower vessel portion 42 containing the magnet coil 25.

The lower tank 27 is connected to the upper helium tank at 4.2 K along a section of reduced cross section analogous to U.S. Pat. No. 5,220,800. These connections can, for example, be effected by ring shaped gaps 45 in the connecting elements 43.

A conical excess pressure stopper 46 can also be integrated into one of the connecting elements 43.

The method of operation as well as the properties of the cryostat 21 in accordance to FIG. 2 largely correspond to those of U.S. Pat. No. 5,220,800, the contents of which are hereby incorporated by reference, so that it is not necessary to explicitly discuss the cryotechnical advantages and details herein.

The substantial difference compared to the system according to U.S. Pat. No. 5,220,800 is that the transverse access 32 to the room temperature bore 23 is created in the vicinity of the vacuum barrier between both helium tanks 26, 27 as a result of which all connections such as vacuum, tank walls, thermal shields and electrical feed-throughs must be passed through the connecting elements or, in the event of an access 32, bypassing same via a transverse bore. The separation between the two helium tanks 26, 27 is thereby somewhat increased which, with regard to the length of structure can be compensated for by making the upper vessel portion 42 shorter and of larger diameter.

In the embodiment according to FIG. 2, the room temperature bore 23 can also be eccentric with respect to one or both axes of the two vessel portions 41, 42 which must not necessarily coincide with each other. However, a symmetric configuration is preferred since it appears more reasonable to minimize the overall diameter, i.e. rotationally symmetric, of the lower vessel portion 41 and to preferably increase the diameter of the likewise rotationally symmetric upper vessel portion 42.

The embodiment according to FIG. 2 also offers advantages when the helium located in both tanks 26, 27 have the same temperature.

We claim:

1. A superconducting magnet system for an analytic NMR spectrometer comprising:

a superconducting solenoid coil for producing a vertically directed extremely homogeneous and stable magnetic field suitable for high resolution NMR spectroscopy in a measuring region said solenoid coil;

a substantially cylindrical cryostat having a vertical cylinder axis, a vertical room temperature bore, and a transverse room temperature access to said vertical room temperature bore, said transverse access disposed directly above said superconducting solenoid coil, said solenoid coil surrounding said room temperature bore; and tank means for holding a cryogenic liquid in thermal contact with said solenoid coil, said tank means disposed in said cryostat directly above said transverse access.

2. The magnet system of claim 1, wherein said transverse room temperature access is a cylindrical bore having a horizontal cylinder axis.

3. The magnet system of claim 2, wherein said transverse access penetrates entirely through said cryostat.

4. The magnet system of claim 2, wherein said transverse access has a plurality of bores arranged in a star-shaped fashion.

5. The magnet system of claim 1, wherein said transverse room temperature access is one of a pie-piece-shaped section and a conical section of the cryostat.

6. The magnet system of claim 1, wherein said cryostat comprises an upper largely cylindrical portion, a lower largely cylindrical portion coaxial with and disposed below said upper portion, and a cylindrically shaped connecting component having a diameter which is small compared to diameters of said upper and lower portions and arranged symmetrically about said vertical cylinder axis to cryotechnically couple said upper portion to said lower portion.

7. The magnet system of claim 6, wherein said upper portion has a diameter largely equal to a diameter of said lower portion.

8. The magnet system of claim 6, wherein said upper portion has a diameter larger than a diameter of said lower portion.

9. The magnet system of claim 8, further comprising a nitrogen tank disposed in said upper vessel portion and a radiation shield disposed in said lower vessel portion, said radiation shield cryotechnically coupled to said nitrogen tank.

10. The magnet system of claim 6, wherein said lower portion has said room temperature bore.

11. The magnet system of claim 6, wherein a vertical height of said cylindrical connecting component is larger than or approximately equal to an axial length of a sample tube for a liquid or solid NMR sample.

12. The magnet system of claim 1, wherein the cryostat comprises a first helium tank in a lower vessel portion, said first helium tank containing said solenoid coil surrounded by supercooled liquid helium having a temperature below 4.2 K, said cryostat comprising an additional helium tank in an upper vessel portion containing helium substantially at atmospheric pressure at approximately 4.2 K, and means for connecting said first helium and said additional helium tanks to each other in such a fashion that helium located in said first helium tank is also substantially at atmospheric pressure.

13. The magnet system of claim 1, wherein an axis of said vertical room temperature bore is disposed at a separation from said vertical cylinder axis.

* * * * *

UNITED STATES PATENT AND TRADEMARK OFFICE
CERTIFICATE OF CORRECTION

PATENT NO. : 5,739,689
DATED : April 14, 1998
INVENTOR(S) : Gerhard Roth, et. al.

It is certified that error appears in the above-identified patent and that said Letters Patent is hereby corrected as shown below:

In claim 1, line 6, please insert following
"measuring region" --about a center of--

Signed and Sealed this

Thirtieth Day of June, 1998

Attest:

BRUCE LEHMAN

Attesting Officer

Commissioner of Patents and Trademarks